(12) United States Patent
Xu et al.

(10) Patent No.: US 10,879,068 B2
(45) Date of Patent: Dec. 29, 2020

(54) EXTREME ULTRAVIOLET LITHOGRAPHY FOR HIGH VOLUME MANUFACTURE OF A SEMICONDUCTOR DEVICE

(71) Applicant: INTERNATIONAL BUSINESS MACHINES CORPORATION, Armonk, NY (US)

(72) Inventors: Yongan Xu, Niskayuna, NY (US); Yann Mignot, Slingerlands, NY (US); John C. Arnold, Nonth Chatham, NY (US); Oleg Gluschenkov, Tannersville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 200 days.

(21) Appl. No.: 15/975,169

(22) Filed: May 9, 2018

(65) Prior Publication Data
US 2019/0348281 A1 Nov. 14, 2019

(51) Int. Cl.
| H01L 21/027 | (2006.01) |
| H01L 21/311 | (2006.01) |
| H01L 21/266 | (2006.01) |
| H01L 21/033 | (2006.01) |

(52) U.S. Cl.
CPC ...... *H01L 21/0275* (2013.01); *H01L 21/0276* (2013.01); *H01L 21/0337* (2013.01); *H01L 21/266* (2013.01); *H01L 21/31144* (2013.01)

(58) Field of Classification Search
CPC ............ H01L 21/0275; H01L 21/0276; H01L 21/0337
See application file for complete search history.

(56) References Cited

U.S. PATENT DOCUMENTS

| 8,101,530 B2 | 1/2012 | Huang et al. |
| 8,652,712 B2 | 2/2014 | Glodde |
| 9,558,973 B2 | 1/2017 | Hawryluk et al. |
| 9,659,784 B1 | 5/2017 | Petterson et al. |
| 2014/0011373 A1* | 1/2014 | Killampalli ........... H01L 21/324 438/795 |
| 2017/0040221 A1 | 2/2017 | Kim et al. |

OTHER PUBLICATIONS

Jung, "Sub-Millisecond Post Exposure Bake of Chemically Amplified Resists by CO2 Laser Hear Treatment", Proceedings of SPIE, vol. 7639, Mar. 2010, pp. 1-9.

(Continued)

*Primary Examiner* — Errol V Fernandes
(74) *Attorney, Agent, or Firm* — Tutunjian & Bitetto, P.C.; James Nock

(57) ABSTRACT

A device and a method for forming the device is contemplated. The device and method include patterning a hardmask formed over a substrate. The hardmask is modified by raising an annealing temperature of the hardmask from a first annealing temperature to a second annealing temperature using ion implantation. The hardmask is annealed with a laser beam using a process temperature between the first annealing temperature and the second annealing temperature.

20 Claims, 10 Drawing Sheets

(56) References Cited

OTHER PUBLICATIONS

Cheng, "Electron-Beam-Induced Freezing of an Aromatic-Based EUV Resist: A Robust Template for Directed Self-Assembly of Block Copolymers", IEEE Transactions on Nanotechnology, vol. 11, No. 6, Nov. 2012, pp. 1140-1147.
Jing, "Controlled Roughness Reduction of Patterned Resist Polymers Using Laser-Induced Sub-Millisecond Heating", Journal of Materials Chemistry C, Sep. 2014, pp. 9115-9121.
Nagahara, "New Approach to Improve LER of EUV Resist Pattern by Chemical and Thermal Treatment", Proceedings of SPIE, vol. 9422, Mar. 2015, pp. 1-9.

\* cited by examiner

EXTREME ULTRAVIOLET LITHOGRAPHY FOR HIGH VOLUME MANUFACTURE OF A SEMICONDUCTOR DEVICE

BACKGROUND

Technical Field

The present invention generally relates to lithographic patterning, and more particularly to extreme ultraviolet lithography for high volume manufacture of a semiconductor device.

Description of the Related Art

Reducing feature sizes on a semiconductor device, such as transistor sizes and gate lengths, improves the performance and efficiency of the semiconductor device. However, reducing the size of the process can be limited by factors such as the wavelength of the laser used for lithographic patterning, the material used for a etch hardmask that is being patterned, as well as other limiting factors.

SUMMARY

In accordance with an embodiment of the present invention, a method for forming a semiconductor device is contemplated. The method includes patterning a hardmask formed over a substrate. The hardmask is modified by raising an annealing temperature of the hardmask from a first annealing temperature to a second annealing temperature using ion implantation. The hardmask is annealed with a laser beam using a process temperature between the first annealing temperature and the second annealing temperature.

In accordance with an embodiment of the present invention, a method for forming a semiconductor device is contemplated. The method includes depositing a hardmask on a substrate. The hardmask is patterned using extreme ultraviolet lithography. The hardmask is modified by raising an annealing temperature of the hardmask from a first annealing temperature to a second annealing temperature using ion implantation. The hardmask is annealed with a laser beam using a process temperature between the first annealing temperature and the second annealing temperature. The substrate is etched selective to the hardmask.

In accordance with an embodiment of the present invention, a method for forming a semiconductor device is contemplated. The method includes implanting ions in a patterned hardmask, such that the ions penetrate through the depth of the hardmask. The hardmask is laser annealed using a process temperature above room temperature such that a line edge roughness (LER) of lines patterned into the hardmask is below a high volume manufacture (HVM) threshold. A substrate is etched through the hardmask to form device structures in the substrate. The hardmask is removed and a semiconductor device is formed on the device structures.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
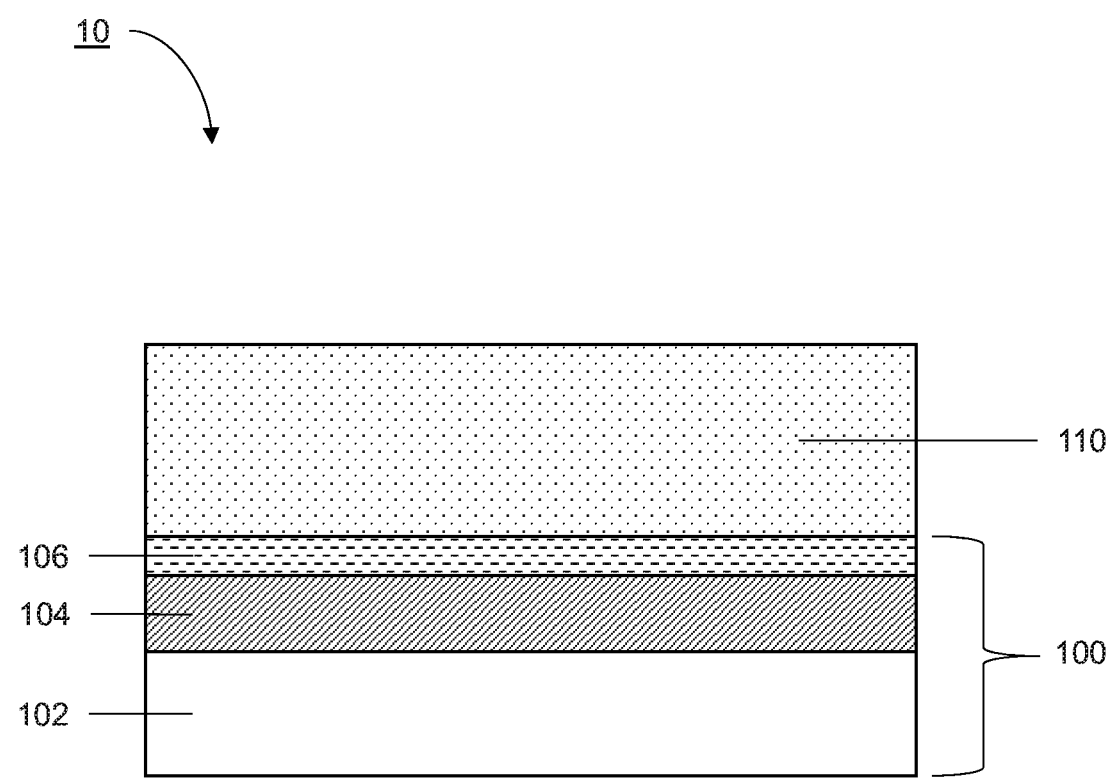
FIG. 1 is a cross-sectional view showing a semiconductor device including a mask formed thereon, in accordance with an embodiment of the present invention.

According to aspects of the present invention, an extreme ultraviolet (EUV) lithographic process for high volume manufacture (HVM) of semiconductor devices is described. In one embodiment, the EUV lithography includes a combination of ion implantation and laser annealing of a lithographically patterned mask.

Once a mask layer is applied to a semiconductor device, lithography can be performed to pattern the mask. In some embodiments of the present invention, Extreme ultraviolet (EUV) light is used to the lithography, however the principles of the present invention are equally applicable to lithography with light at any other wavelength. EUV lithography is one attempt to improve the precision of lithography of an etch mask due to a small wavelength. However, EUV is difficult to implement because it can result in high line edge roughness (LER) of patterned features in the mask, which reduces the performance of etching with the mask and thus reduces yield of the resulting device. For a process to be useable for high volume manufacture (HVM), the LER should be at or below 2.4 nanometers (nm).

By performing ion implantation, the LER of the masking lines can be reduced by depositing material in concave portions of a side of a masking line while depositing very little material on convex portions. The ion implantation also has the added benefit of hardening the mask material and raising its annealing temperature.

Because the annealing temperature has been raised, annealing can be performed at a higher temperature and higher power than would otherwise be possible without melting the mask material. As a result, annealing is performed on the masking lines that further reduces LER while hardening the masking lines. Using laser annealing alone to improve LER in EUV lithography can result in modest improvements to LER, but at the expense of the critical dimension (CD) of the mask lines. Because the annealing temperature of the mask is higher after the ion implantation, the higher power annealing will not cause deformation in the masking lines, and therefore will not adversely affect the critical dimension (CD) of the masking lines.

Exemplary applications/uses to which the present invention can be applied include, but are not limited to: fabrication of semiconductor devices, including transistors, memory devices, and other devices benefit from lithographic processing.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, an illustration of a cross-sectional view showing a semiconductor device including a mask formed thereon according to an embodiment of the present invention.

According to aspects of the present invention, a semiconductor device 10 has a mask 110 formed thereon. The semiconductor device 10 can include a bulk substrate 100. The bulk substrate 100 can be a single substrate formed of a suitable semiconducting material, such as, e.g., silicon (Si), silicon germanium (SiGe), silicon carbide (SiC), gallium arsenide (GaAs), or any other suitable semiconducting group II, III, IV, V or VI material and combinations thereof.

However, the bulk substrate 100 can also include multiple layers. For example, the bulk substrate 100 can include a base substrate 102. The base substrate 102 can be a suitable semiconducting material, such as Si, SiGe, GaAs, InAs and other like semiconductors. Layered semiconductors such as Si/Ge and Semiconductor-On-Insulators (SOI) are also contemplated herein. Si-containing materials include, but are not limited to: Si, single crystal Si, polycrystalline Si, SiGe, amorphous Si, silicon-on-insulator substrates (SOI), SiGe-on-insulator (SGOI), annealed poly Si, and poly Si line structures. The Si-containing material can be the substrate of the device, or a Si-containing layer formed atop the substrate, e.g., a polySi gate or a raised source/drain region.

Formed on the base substrate 102 can be an etch assist layer 104. The etch assist layer 104 can include a material that has a higher etch selectivity with the base substrate 102 compared to the mask 110. Accordingly, the etch assist layer 104 can include, e.g., a planarization layer formed of, e.g., a suitable oxide, or a spin-on carbon layer. As a result, when the etch assist layer 104 is etched, a second etching process can be used to transfer the etched pattern into the substrate 102 with a high degree of etch selectivity, thus improving the pattern transfer into the substrate.

Formed on the etch assist layer 104 can be a bottom anti-reflective coating (BARC) 106. The BARC 106 provides for a light absorption layer. As a result, the BARC 106 prevents reflection of light used for lithography, thus preventing backscattering, standing waves, reflective notching, and other effects detrimental to accurate lithography. Thus, the BARC 106 assists with accurate control of a critical dimension (CD) in lithographic patterning. Accordingly, the BARC 106 can be formed of a suitable low-reflectivity material, including organic or inorganic materials.

Formed over the bulk substrate 100 is the mask 110. The mask 110 can be deposited over the top surface of the bulk substrate 100 by a deposition process, such as, e.g., chemical vapor deposition (CVD), or other suitable deposition process. The mask 110 can then be patterned using a suitable patterning process, such as, e.g., lithography, including EUV lithography, a positive tone photoresist process, or a negative tone photoresist process, or any other suitable patterning process.

Figure 2:
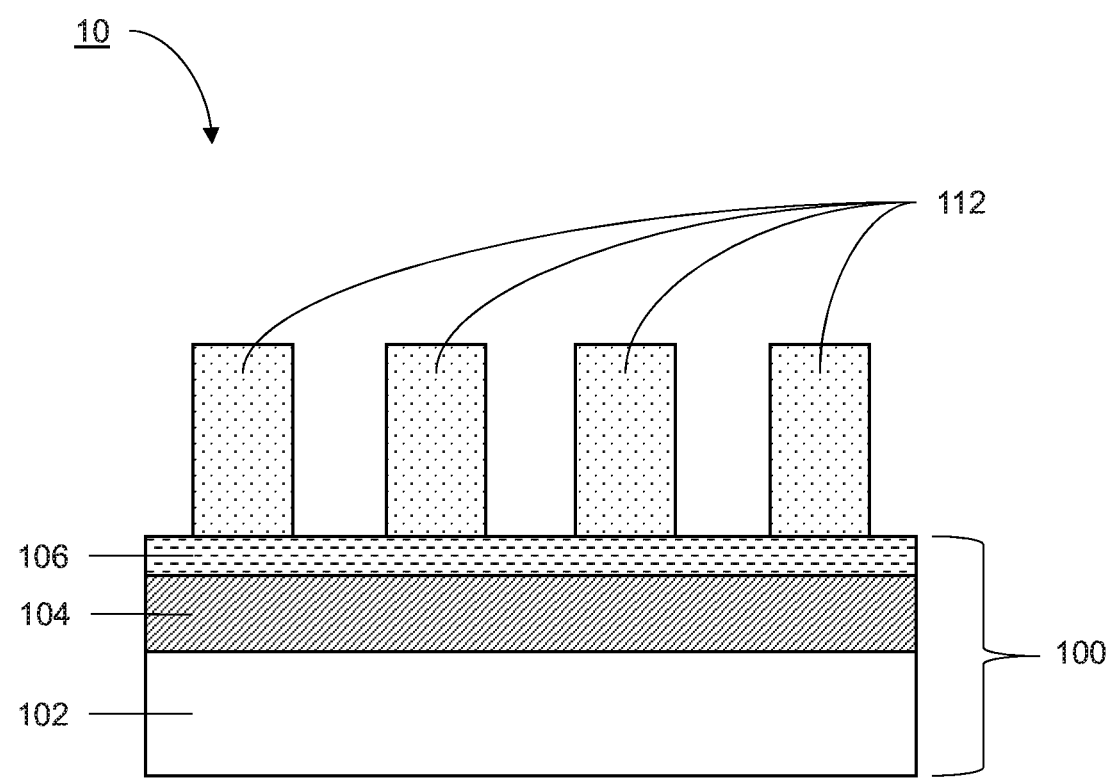
FIG. 2 is a cross-sectional view showing a semiconductor device including a lithographically patterned mask, in accordance with an embodiment of the present invention.

Referring now to FIG. 2, an illustration of a cross-sectional view showing a semiconductor device including a lithographically patterned mask according to an embodiment of the present invention.

According to aspects of an embodiment of the present invention, the mask 110 is patterned by EUV lithography to form mask lines 112 corresponding to the patterning. The EUV lithography uses light with a wavelength in the extreme ultraviolet range for extremely fine resolution patterning. Using the EUV lithographic process, the mask lines 112 can be formed by removing material between the mask lines 112 according to a predetermined pattern. Using such a process, the mask lines 112 can be formed with pitch sizes from between about 20 nanometers (nm) and about 40 nm with a mask line 112 width of, e.g., about 25 nm or less.

The mask 110 can be formed of any suitable material for being removed by EUV lithography to form mask lines 112. Accordingly, the mask 110 and mask lines 112 can be formed of, e.g., a suitable polymer.

Figure 3:
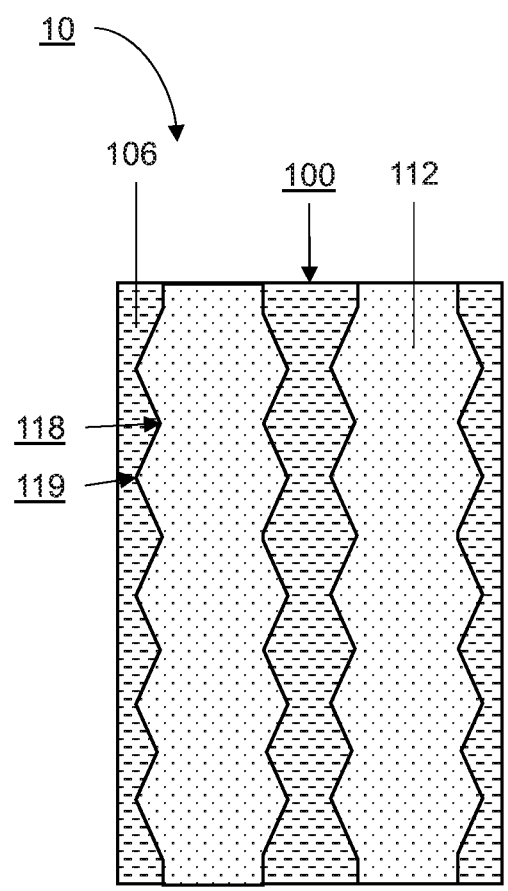
FIG. 3 is a top view showing a semiconductor device after lithographic patterning of a mask, in accordance with an embodiment of the present invention.

Referring now to FIG. 3, an illustration of a top view showing a semiconductor device after lithographic patterning of a mask according to an embodiment of the present invention.

According to aspects of an embodiment of the present invention, mask lines 112 of a semiconductor device 10 can appear as pictured in FIG. 3. While patterning with EUV lithography would result in mask lines 112 having a small pitch, the lithography can result in line edge roughness (LER). As depicted, the LER results in mask lines 112 that are generally straight but not entirely smooth. A larger LER results in less control of the CD and more defects, and thus decreased device yields. With the EUV lithography of the present embodiment, LER is, on average, about 3.59 nm within about 1.96 standard deviations ($\sigma$) of the mean (a $3\sigma$ of about 1.96).

Figure 4A:
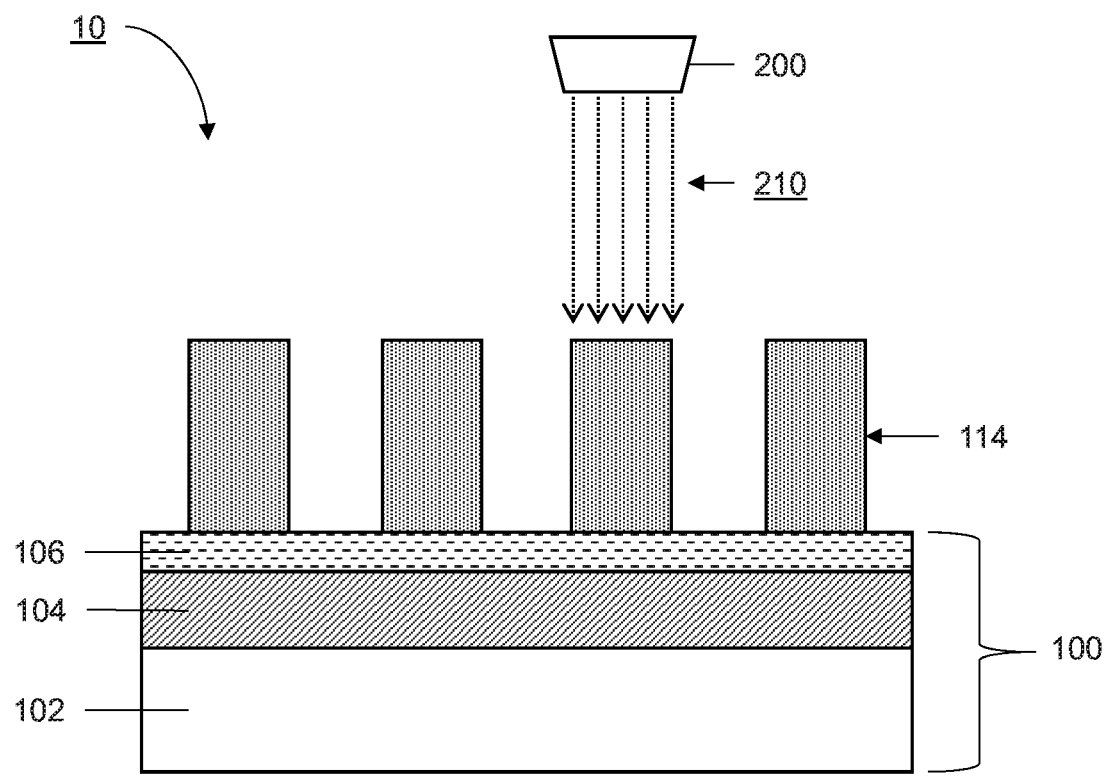
FIG. 4A is a cross-sectional view showing a semiconductor device including a lithographically patterned mask undergoing a vertically oriented alternative for ion implantation of the mask, in accordance with an embodiment of the present invention.

Referring now to FIG. 4A, an illustration of a cross-sectional view showing a semiconductor device including a lithographically patterned mask undergoing a vertically oriented alternative for ion implantation of the mask according to an embodiment of the present invention.

According to aspects of the present invention, LER can be reduced, with a hardening of the mask lines 112 by ion implantation or deposition to form hardened mask lines 114. Implanting or depositing ions, such as, e.g., carbon (C), silicon (Si), antimony (Sb), phosphorous (P), boron (B), nitrogen (N), sulfur (S), or other suitable ions, can change the physical, chemical and electrical structure of the mask lines 112.

By increasing the strength of the mask lines 112, the annealing temperature of the mask lines 112 will increase. As a result, subsequent process, such as annealing or baking, can be performed at higher temperatures with minimal effect on the CD. In particular, the mask lines 112 prior to ion implantation have an annealing temperature $T_g^1$ that is increased by ion implantation to a second annealing temperature of $T_g^2$ where $T_g$ is the temperature at which the CD will undergo a 10% change. According to aspects of the present invention, the difference between $T_g^1$ and $T_g^2$ is about 80 Kelvin, which is about a 21% increase in the annealing temperature in Kelvin.

Additionally, the ion implantation or deposition can increase the etch selectivity of the hardened mask lines 114 relative to the layers of the substrate 100 when compared to mask lines 112.

Furthermore, even in ion implantation processes, reactions of ions with free radicals in the ambient plasma as well as on the surface of the mask lines 112 will deposit material on the surface of the mask lines 112. The deposition will be uneven, depositing more material in concave portions 118 of the surface of the mask lines 112, and less on convex portions 119. As a result, the ion implantation or deposition process will further serve to reduce LER in the hardened mask lines 114 compared to the mask lines 112.

Therefore, a process, such as, e.g., ion implantation by in-situ radical assist deposition (iRAD) or ion beam deposition, or other ion implantation process, can be performed on mask line 112 to improve hardness, LER, etch selectivity and annealing temperature by implanting ions to a depth within the mask lines 112 between about 5 and about 25 nm to reach the resist line width. Accordingly, ions can be implanted with an ion beam 210 having an energy of between about 0.5 and about 2 keV for C ions. Additionally, a beam energy of between about 1.5 and about 3.5 keV for Sb, between about 0.5 and about 3.8 keV for Si and between about 0.5 and about 3.5 for P ions, as well as other configurations, are contemplated. An implantation ion beam 210 dose can be any suitable dose, such as, e.g., between about $1 \times 10^{13}$ and about $1 \times 10^{16}$ ions/cm$^2$.

According to one embodiment of the present invention, the ion beam 210 can be projected by the beam source 200 directly vertically over the mask lines 112. Thus the ions will be implanted from top down through the full depth of the mask lines 112 to produce hardened mask lines 114.

Figure 4B:
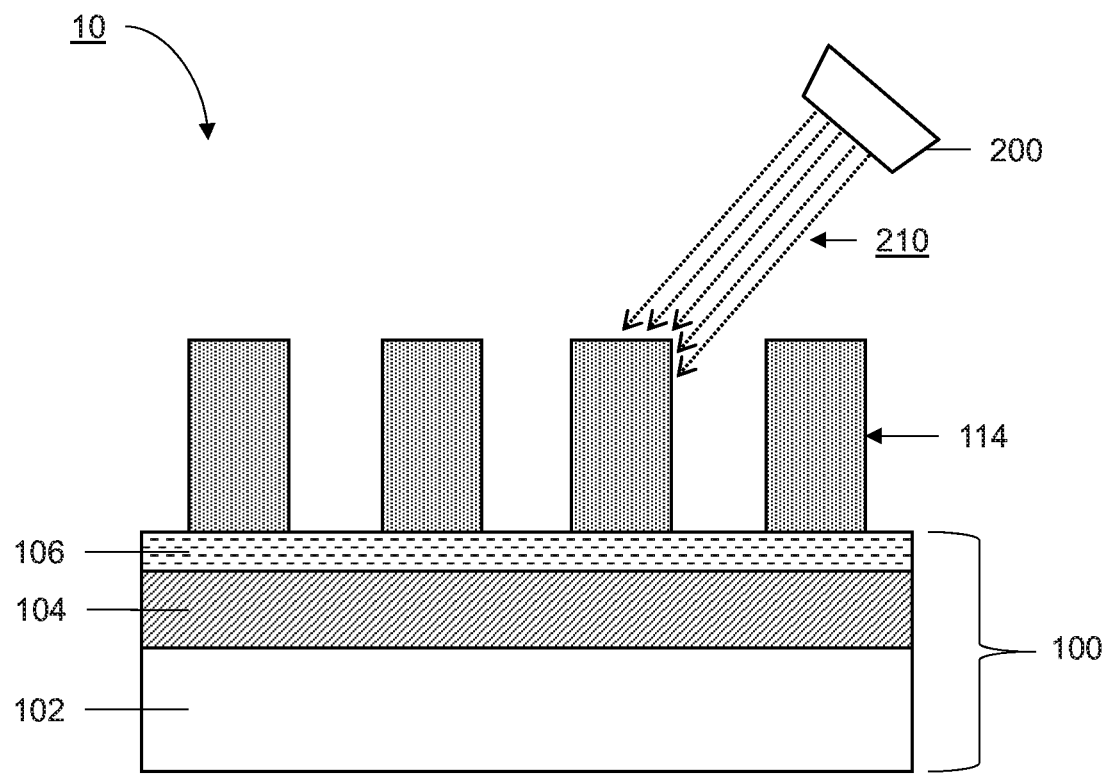
FIG. 4B is a cross-sectional view showing a semiconductor device including a lithographically patterned mask undergoing an alternative for ion implantation, at an angle, of the mask, in accordance with an embodiment of the present invention.

Referring now to FIG. 4B, an illustration of a cross-sectional view showing a semiconductor device including a lithographically patterned mask undergoing an alternative for ion implantation, at an angle, of the mask according to an embodiment of the present invention.

According to another embodiment of the present invention, the ion beam 210 can be projected by the beam source 200 at an angle towards the mask lines 112. Thus the ions will be implanted from the side through the full width of the mask lines 112. By orienting the beam 210 to at an angle relative to sides of the mask lines 112, sputtering can occur by the ion beam along the sides of the mask lines 112. The sputtering serves to deposit material in the concave portions 118 of the mask line 112 sides, while eroding the convex portions 119. Thus, implanting from at an angle can improve LER while producing hardened mask lines 114. Accordingly, a suitable angle for the ion beam 210 can employed, for example, at an angle of between about 30 degrees and about 45 degrees relative to the vertical axis.

Figure 5:
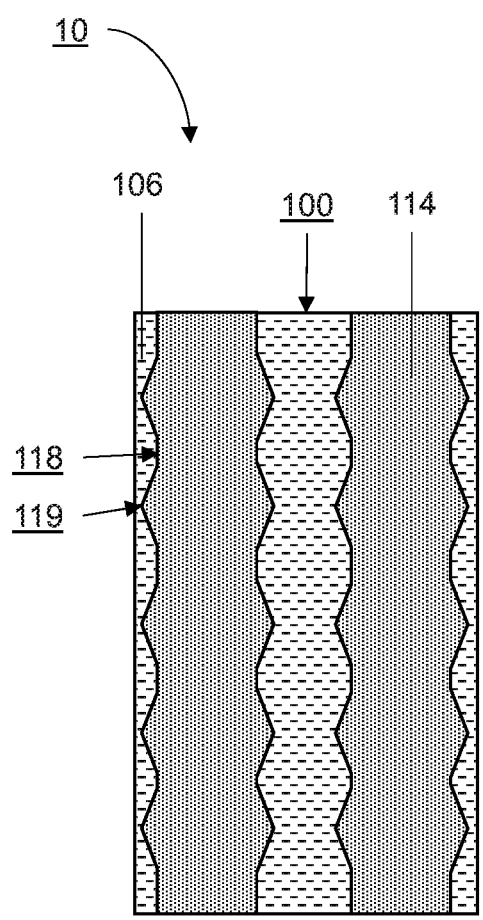
FIG. 5 is a top view showing a semiconductor device after ion implantation of a mask, in accordance with an embodiment of the present invention.

Referring now to FIG. 5, an illustration of a top view showing a semiconductor device after ion implantation of a mask, in accordance with an embodiment of the present invention according to an embodiment of the present invention.

According to aspects of an embodiment of the present invention, hardened mask lines 114 of a semiconductor device 10 can appear as pictured in FIG. 5. Performing ion implantation to form hardened mask lines 114 reduces LER to, on average, e.g., about 3.38 nm with a 3σ of about 0.53. Furthermore, CD is minimally affected, shrinking by a value of about 1 nm or less. The minor CD shrink in the lines can be easily offset by an optical proximity correction (OPC) step or by lithography dose adjustment.

Figure 6:
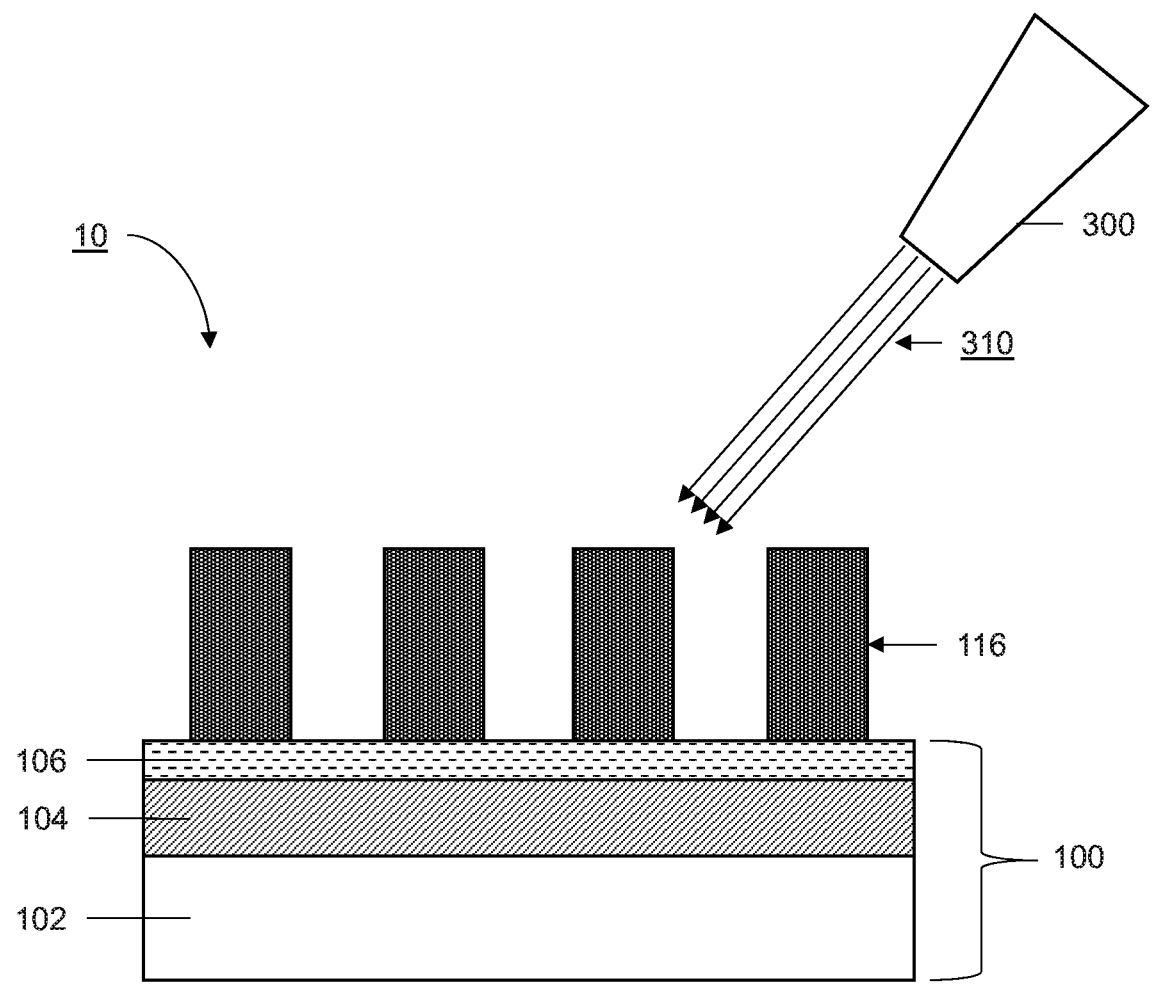
FIG. 6 is a cross-sectional view showing a semiconductor device including a lithographically patterned mask undergoing laser annealing, in accordance with an embodiment of the present invention.

Referring now to FIG. 6, an illustration of a cross-sectional view showing a semiconductor device including a lithographically patterned mask undergoing laser annealing according to an embodiment of the present invention.

LER in the hardened masking lines 114 can be further reduced and hardness can be improved through annealing. According to aspects of the present invention, annealing can be performed by laser annealing. Therefore, a laser 300 can emit a laser beam 310 towards the hardened mask lines 114 to anneal the hardened mask lines 114 and produce annealed mask lines 116. The laser 300 can be any suitable laser for anneal, such as, e.g., a $CO_2$ laser. Accordingly, the wavelength of the laser beam 310 can be a corresponding wavelength suitable for annealing, such as, e.g., a wavelength of about 880 nm.

The hardened mask lines 114 can be annealed with a chuck securing the substrate 100, the chuck being maintained at a temperature above $T_g^1$ but below $T_g^2$. Therefore, a higher process temperature is used for anneal than can be used on mask lines that have not undergone ion implantation because such mask lines would melt, affecting the CD of the mask lines. As a result, laser annealing can be performed at room temperature or above, for example, at a chuck temperature of between about 40 degree C. and about 100 degree C. The laser 300 can emit the laser beam 310, e.g., between about 300 W and about 500 W. However, in a particular embodiment, laser annealing is performed at about 420 W with a chuck temperature of about 80 degree C. As a result, CD undergoes minimal change because temperature is kept below $T_g^2$, but LER is decreased by about 25%. Meanwhile, the annealed mask lines 116 are also harder with improved etch selectivity to the surrounding materials.

Figure 7:
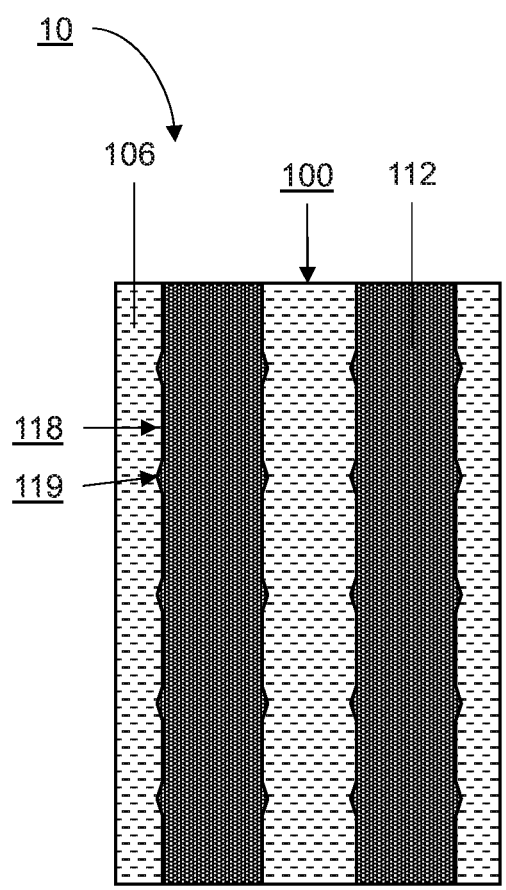
FIG. 7 is a top view showing a semiconductor device with an ion implanted mask having undergone laser annealing, in accordance with an embodiment of the present invention.

Referring now to FIG. 7, an illustration of a top view showing a semiconductor device with an ion implanted mask having undergone laser annealing according to an embodiment of the present invention.

According to aspects of an embodiment of the present invention, annealed mask lines 116 of a semiconductor device 10 can appear as pictured in FIG. 5. Performing laser annealing on hardened mask lines 114 to form annealed mask lines 116 further reduces LER to, on average, about 2.68 nm with a 3σ of about 0.17 using a 420 Watt laser at an 80 degree Celsius chuck temperature. This represents a 25% reduction in LER compared to pre-hardened mask lines 112. Alternatively, a lower power laser at a lower chuck temperature can be used, such as a 350 W laser at a 40 degree Celsius chuck temperature. In such a case, LER is reduced to, on average, about 3.30 nm with a 3σ of about 0.341. Furthermore, CD is minimally affected, shrinking by a value of about 1 nm or less. The minor CD shrink in the lines can be easily offset by an optical proximity correction (OPC) step or by lithography dose adjustment.

Figure 8:
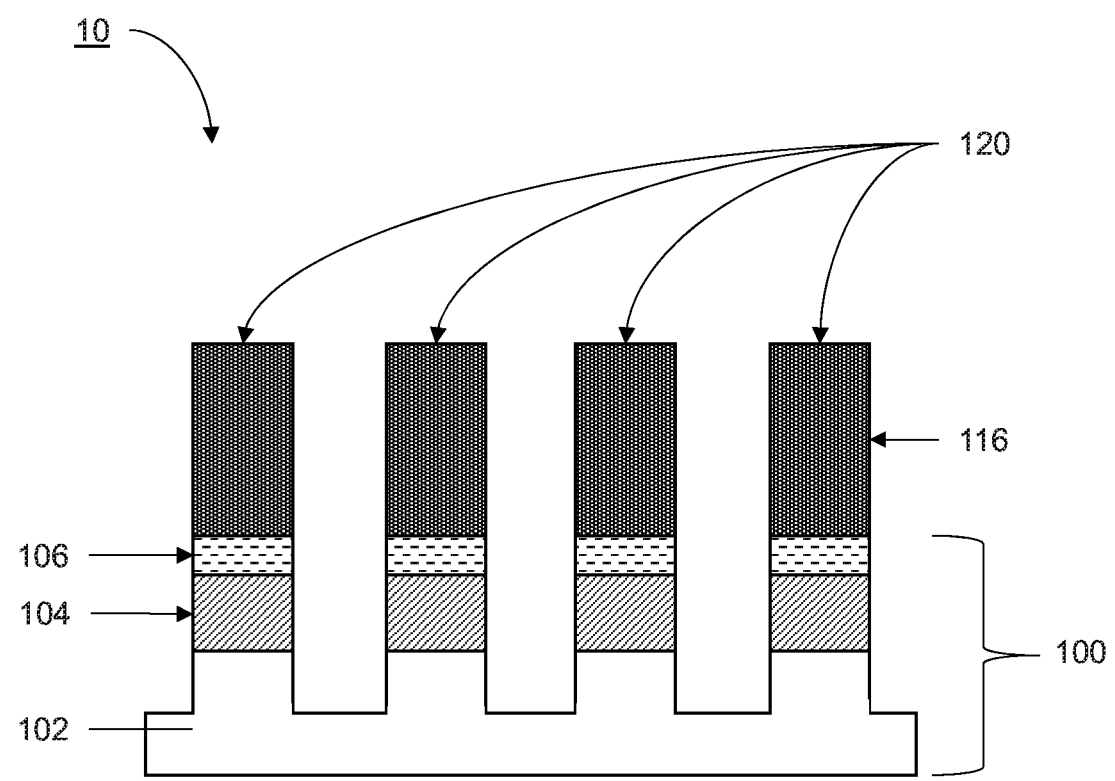
FIG. 8 is a cross-sectional view showing a semiconductor device with a hardened mask and fins etched into a bulk substrate through the mask, in accordance with an embodiment of the present invention.

Referring now to FIG. 8, an illustration of a cross-sectional view showing a semiconductor device with a hardened mask and fins etched into a bulk substrate through the mask according to an embodiment of the present invention.

According to aspects of the present invention, the annealed mask lines 116 are used to etch the pattern into the substrate 100. Etching into the substrate 100 can include one or more etch processes to etch down into each layer of the substrate 100 to form fins 120. Accordingly, an etch process can be used to etch the material of each of the base substrate 102, etch assist layer 104 and BARC 106 selective to the annealed mask lines 116. The etch process can include a suitable process for selective etching, such as, e.g., anisotropic etching including reactive ion etching (RIE) or other suitable etch processes.

Because the combination of ion implantation and annealing reduces the LER of patterned mask lines, the fins 120 are accurately and precisely etched. Thus, defects are reduced and device yields are increased, contributing to HVM. Similarly, because the ion implantation and annealing increases the strength and hardness of the patterned mask lines, etch selectivity to the other materials of the semiconductor device 10 is improved. Accordingly, the etch process is more accurate and precise, resulting in fewer defects in the fins 120. Thus, device yields are further improved, contributing to HVM.

Figure 9:
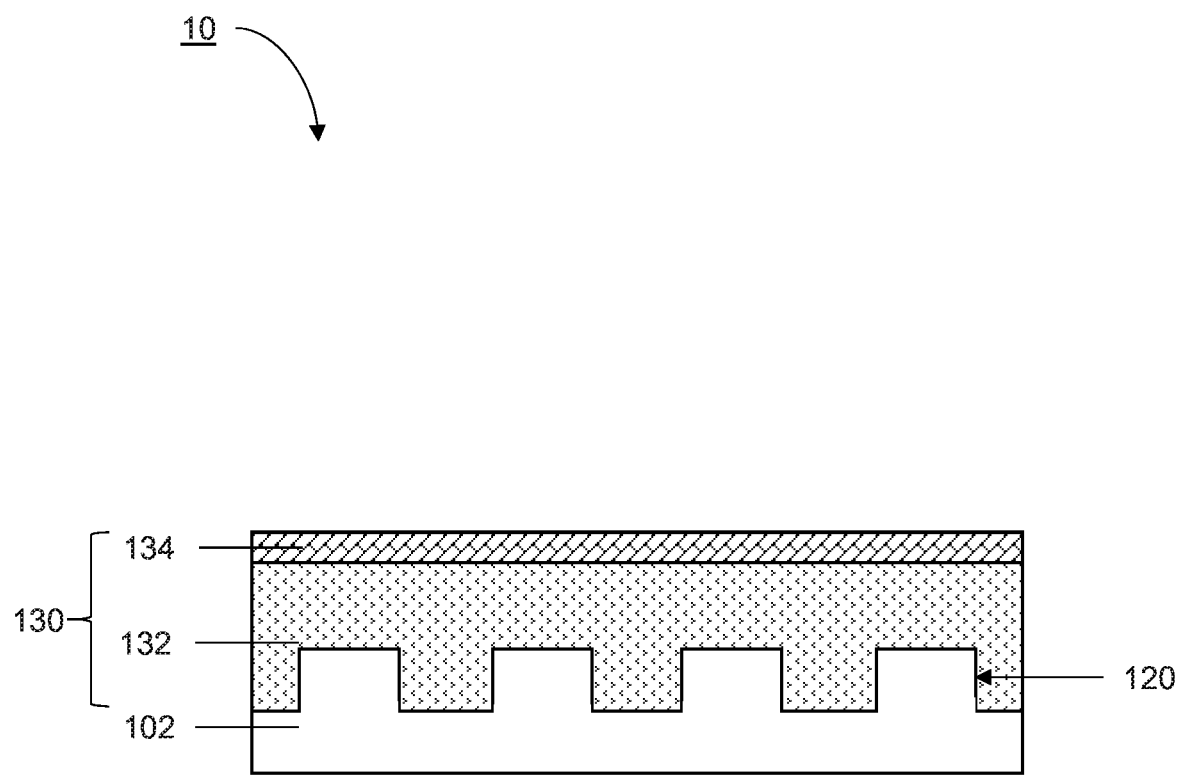
FIG. 9 is a cross-sectional view showing a semiconductor device with fins etched into a substrate using an EUV lithography patterned mask and having a gate structure formed thereon, in accordance with an embodiment of the present invention.

Referring now to FIG. 9, an illustration of a cross-sectional view showing a cross-sectional view showing a semiconductor device with fins etched into a substrate using an EUV lithography patterned mask and having a gate structure formed thereon according to an embodiment of the present invention.

According to aspects of the present invention, the annealed mask lines 116 can be used to etch a pattern of lines into the base substrate 102 to form, e.g., front end of line (FEOL) structures including, e.g., semiconductor fins 120. Upon etching the fins 120, the annealed mask lines 116, BARC 106 and etch assist layer 104 can be removed. These layers can be removed by a suitable process, including, e.g., an isotropic etch process selective to the base substrate 102, or chemical mechanical planarization (CMP), among other processes.

To form a semiconductor device 10, other device elements can then be formed over the fins 120. For example, a gate structure 130 can be formed across the semiconductor device 10, over and around the fins 120. The gate structure 130 can include a gate conductor 132 and a gate cap 134. Thus, a fin-type field effect transistor (fin FET) is formed using EUV lithography.

Operation of the fins 120 and the gate structure 130 is strongly affected by the quality of the fins 120. Imperfections can be imposed on the fins 120 by etching mask lines having imperfections. For example, mask lines with a high LER would result in fins 120 with a high LER. If LER is large enough, then the imperfections will cause some of the fins 120 to be defective. With enough defective fins, the device on the whole can become defective. Accordingly, keeping LER low is important for maintain high yields, which is in turn important for HVM. Accordingly, a suitable LER for HVM is below 3 nm, and certainly below 2.4 nm. Therefore, in accordance with an aspect of the present invention, LER can be used a measure of suitability of a process for HVM of devices made by that process. As such, a threshold measure of LER may be used to determine whether a process is suitable for HVM. This threshold can be referred to as an HVM threshold or an LER threshold. Thus, by performing ion implantation on mask line 112 to form hardened mask lines 114, and then annealing the hardened mask lines 114 to form annealed mask lines 116, LER is reduced. Thus, edge roughness of the resulting fins 120 is reduced, improving fin quality and device quality by having an LER closer to, and even below, an HVM threshold of 2.4 nm.

While the above example relates to a FEOL application, the ion implantation and annealing of mask lines described above may also be used for other FEOL structures, such as, e.g., structures for forming transistors, capacitors, resistors, and other FEOL structures. Additionally, the above described mask lines can also be used to form middle of line (MOL) and back end of line (BEOL) structures, such as, e.g., contacts (pads), interconnect wires, vias and dielectric structures, among others.

Figure 10:
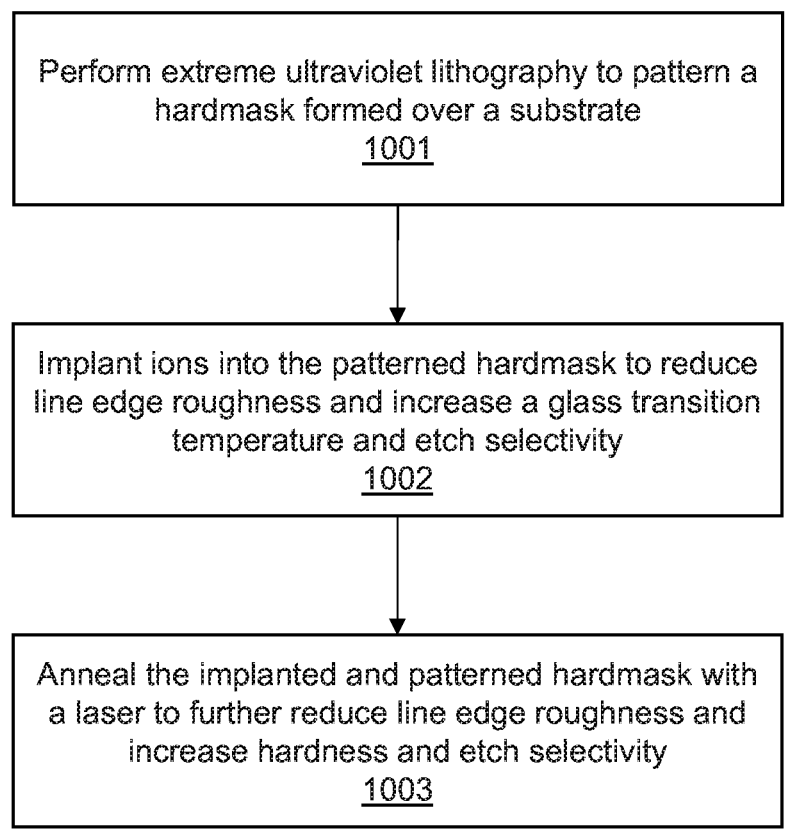
FIG. 10 is a block/flow diagram showing a system/method for a semiconductor device formed with an extreme ultraviolet (EUV) process for high volume manufacture (HVM), in accordance with an embodiment of the present invention.

Referring now to FIG. 10, an illustration of a block/flow diagram showing a system/method for a semiconductor device formed with an EUV process for HVM according to an embodiment of the present invention.

At block 1001, extreme ultraviolet lithography (EUV) is performed to pattern a hardmask formed over a substrate.

Patterning a hardmask to have lines of small pitch sizes facilitates the formation of transistor elements and other semiconductor features of correspondingly small pitch sizes. In some cases, the size of the pitch is limited by the wavelength of the light being used for lithography. Accordingly, using EUV light, which has a relatively small wavelength, can facilitate smaller pitch sizes, and thus smaller semiconductor features. The EUV lithography can be performed by a suitable EUV source, such as, e.g., a laser diode or other light source. By projecting the EUV light in a beam onto the hardmask, material of the hardmask is removed, leaving behind a pattern of mask lines.

At block 1002, ions are implanted into the patterned hardmask to reduce line edge roughness and increase an annealing temperature and etch selectivity.

Using EUV for lithography facilitates small semiconductor feature sizes, but also provides complications to the reliable formation of those features by way of imperfections in the mask lines. These imperfections include LER and line width roughness (LWR). A high degree of LER and LWR can cause semiconductor features to fail or be inoperable. As a such, reducing the LER and LWR of the mask lines can facilitate high yields in manufacturing with EUV lithography.

One way to reduce LER is to employ ion implantation into the mask lines. This process both hardens the material of the mask as well as reduces LER by sputtering material on the sides of the mask lines. Thus, concave portions 118 of the sides of the mask lines are filled with material while convex portions 119 have very little material deposited thereon. Indeed, the ion implantation can remove material from convex portions 119, further straightening the sides and reducing LER. Furthermore, the ion implantation process increases the annealing temperature of the material of the mask lines by up to, e.g., 21%.

According to aspects of the present invention, the ion implantation can implant ions into the mask lines up to the full depth and width of the mask lines, e.g., between about 5 nm and about 25 nm into the mask lines. Accordingly, ion implantation can be carried out using an iRAD process using ions from a suitable material, such as, e.g., C, Sb, Si, P, B, S, N or others. The implantation process can be performed by, e.g., projecting an ion beam vertically down onto the mask lines, or at an angle, such as, e.g., between about 30 degrees and about 45 degrees relative to a vertical axis. The beam can have an energy of, e.g., between about 1.5 and about 3.5 keV for Sb, between about 0.5 and about 3.8 keV for Si and between about 0.5 and about 3.5 for P ions, as well as other configurations, are contemplated. Additionally, the ion beam dose can be any suitable dose, such as, e.g., between about $1 \times 10^{13}$ and about $1 \times 10^{16}$ ions/cm$^2$.

At block 1003, the implanted and patterned hardmask is annealed with a laser to further reduce line edge roughness and increase hardness and etch selectivity.

The mask lines hardened by ion implantation can still have imperfections that are not suitable to HVM. For example, LER cannot be low enough for practical HVM. Thus, the mask lines can be further improved by, e.g., annealing the mask lines. Because the ion implantation increased the annealing temperature of the material of the mask lines, a relatively high temperature and high power process can be used to anneal the mask lines. For example, a laser annealing process can be used that utilizes a chuck temperature that is above room temperature, for example, between about 40 degree C. and about 80 degree C. Moreover, a laser can be used that projects a beam between about 350 W and about 450 W. According to aspects of an embodiment of the invention, a laser annealing process utilizing a chuck temperature of 80 degree C. and a beam of 420 W improved the LER of the mask lines by about 21%. As a result, the mask lines, after annealing, can have an LER, on average, about 2.68 nm with a 3σ of about 0.17 with little detriment to the CD.

Having described preferred embodiments of a system and method (which are intended to be illustrative and not limiting), it is noted that modifications and variations can be made by persons skilled in the art in light of the above teachings. It is therefore to be understood that changes can be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, the method comprising:
   modifying a patterned hardmask by raising an annealing temperature of the hardmask from a first annealing temperature to a second annealing temperature using ion implantation;
   annealing the hardmask using a process temperature between the first annealing temperature and the second annealing temperature;
   etching a substrate through the hardmask to form device structures in the substrate, the device structures having a line edge roughness (LER);
   removing the hardmask; and
   forming a semiconductor device on the device structures.

2. The method as recited in claim 1, wherein patterning the hardmask includes patterning using extreme ultraviolet (EUV) light.

3. The method as recited in claim 1, wherein the hardmask is patterned to form lines with a pitch size between about 20 nanometers and about 40 nanometers.

4. The method as recited in claim 1, wherein the ion implantation includes implanting ions of a material selected the group consisting of carbon, antimony, silicon, phosphorous, boron, nitrogen, sulfur, and combinations thereof.

5. The method as recited in claim 1, wherein the device structures include components selected from the group consisting of back end of line (BEOL), middle of line (MOL) and front end of line (FEOL) components.

6. The method as recited in claim 1, wherein the ion implantation implants ions to a depth equal to a width of lines patterned into the hardmask.

7. The method as recited in claim 1, wherein the process temperature is greater than ambient temperature.

8. The method as recited in claim 1, wherein annealing the hardmask include laser annealing for a duration in a range between about 1 nanosecond and about 5 milliseconds.

9. The method as recited in claim 1, wherein the second annealing temperature is about 21 percent greater than the first annealing temperature in Kelvin.

10. A method for forming a semiconductor device, the method comprising:
    depositing a hardmask on a substrate;
    patterning the hardmask using extreme ultraviolet lithography;
    modifying the hardmask by raising an annealing temperature of the hardmask from a first annealing temperature to a second annealing temperature using ion implantation;
    annealing the hardmask using a process temperature between the first annealing temperature and the second annealing temperature;
    etching a substrate through the hardmask to form fins in the substrate, the fins having a line edge roughness (LER);
    removing the hardmask; and
    forming a gate structure across the fins.

11. The method as recited in claim 10, wherein the hardmask is patterned to form lines with a pitch size between about 20 nanometers and about 40 nanometers.

12. The method as recited in claim 10, wherein the ion implantation includes implanting ions of a material selected the group consisting of carbon, antimony, silicon, phosphorous, boron, nitrogen, sulfur, and combinations thereof.

13. The method as recited in claim 10, further comprising in-situ radical assist deposition (iRAD) to perform the ion implantation.

14. The method as recited in claim 10, wherein the ion implantation implants ions to a depth equal to a width of lines patterned into the hardmask.

15. The method as recited in claim 10, wherein the second annealing temperature is about 21 percent greater than the first annealing temperature in Kelvin.

16. A method for forming a semiconductor device, the method comprising:
    implanting ions in a patterned hardmask, such that the ions penetrate through the depth of the hardmask, thereby raising an annealing temperature of the hardmask from a first annealing temperature to a second annealing temperature;
    laser annealing the hardmask using a process temperature above room temperature to reduce a line edge roughness (LER) of lines patterned into the hardmask;
    etching a substrate through the hardmask to form device structures in the substrate;
    removing the hardmask; and
    forming a semiconductor device on the device structures.

17. The method as recited in claim 16, wherein the hardmask is patterned to form lines with a pitch size between about 20 nanometers and about 40 nanometers.

18. The method as recited in claim 16, wherein the LER is about 2.4 nm or below.

19. The method as recited in claim 16, wherein the ions include a material selected the group consisting of carbon, antimony, silicon, phosphorous, boron, nitrogen, sulfur, and combinations thereof.

20. The method as recited in claim 16, the device structures including components selected from the group consisting of back end of line (BEOL), middle of line (MOL) and front end of line (FEOL) components.

* * * * *